US012199571B2

(12) United States Patent
Geng et al.

(10) Patent No.: US 12,199,571 B2
(45) Date of Patent: Jan. 14, 2025

(54) HYBRID DOHERTY POWER AMPLIFIER MODULE

(71) Applicant: Ampleon Netherlands B.V., Nijmegen (NL)

(72) Inventors: Zhi Geng, Nijmegen (NL); Yi Zhu, Nijmegen (NL)

(73) Assignee: Ampleon Netherlands B.V., Nijmegen (NL)

( * ) Notice: Subject to any disclaimer, the term of this patent is extended or adjusted under 35 U.S.C. 154(b) by 519 days.

(21) Appl. No.: 17/651,593

(22) Filed: Feb. 18, 2022

(65) Prior Publication Data
US 2022/0271715 A1    Aug. 25, 2022

(30) Foreign Application Priority Data

Feb. 19, 2021 (NL) ..................................... 2027603

(51) Int. Cl.
  *H03F 1/02*    (2006.01)
  *H01L 23/66*   (2006.01)
  (Continued)

(52) U.S. Cl.
  CPC ........... *H03F 1/0288* (2013.01); *H01L 23/66* (2013.01); *H03F 1/565* (2013.01); *H03F 3/195* (2013.01);
  (Continued)

(58) Field of Classification Search
  CPC ........ H03F 1/0288; H03F 1/565; H03F 3/195; H03F 3/245; H03F 2200/451; H01L 23/66; H01L 2223/6611; H01L 2223/6655
  (Continued)

(56) References Cited

U.S. PATENT DOCUMENTS 10,530,306 B2 *  1/2020  Srinidhi Embar ...... H03F 3/213
11,522,499 B2 * 12/2022  Hue ......................... H01L 24/48
(Continued)

FOREIGN PATENT DOCUMENTS

EP    3322091 A1 *  5/2018  ........... H03F 1/0288
EP    3832884 B1 *  8/2024  ......... H01L 23/4824

OTHER PUBLICATIONS

PCT International Search Report and Written Opinion, Application No. NL2027603, dated Oct. 29, 2021, 10 pages.

*Primary Examiner* — Hafizur Rahman
(74) *Attorney, Agent, or Firm* — McDonnell Boehnen Hulbert & Berghoff LLP

(57) ABSTRACT

Example embodiments relate to hybrid Doherty power amplifier modules. One embodiment includes a printed circuit board having an input RF terminal and an output RF terminal, and on which printed circuit board a primary Doherty amplifier is integrated. The primary Doherty amplifier includes a primary Doherty splitter arranged on the printed circuit board and configured for splitting an input RF signal received at the input RF terminal into a plurality of RF signal components. The primary Doherty amplifier also includes a plurality of amplifying paths, each amplifying path being partially integrated on a semiconductor die of a first kind mounted on the printed circuit board and partially integrated on a semiconductor die of a second kind mounted on the printed circuit board. Further, the primary Doherty amplifier includes a primary Doherty combiner arranged on the printed circuit board.

20 Claims, 5 Drawing Sheets

(51) Int. Cl.
  *H03F 1/56* (2006.01)
  *H03F 3/195* (2006.01)
  *H03F 3/24* (2006.01)
(52) U.S. Cl.
  CPC ...... *H03F 3/245* (2013.01); *H01L 2223/6611* (2013.01); *H01L 2223/6655* (2013.01); *H03F 2200/451* (2013.01)
(58) Field of Classification Search
  USPC .................................................. 330/124 R
  See application file for complete search history.

(56) References Cited

U.S. PATENT DOCUMENTS

| | | |
|---|---|---|
| 2011/0175677 A1 | 7/2011 | Jeong et al. |
| 2012/0032738 A1 | 2/2012 | Uchiyama |
| 2017/0026001 A1 | 1/2017 | Moronval et al. |
| 2018/0159479 A1* | 6/2018 | Wu ........................ H03F 1/0288 |
| 2018/0248521 A1* | 8/2018 | Min ........................ H03F 1/565 |
| 2019/0319587 A1* | 10/2019 | Srinidhi Embar ...... H03F 1/565 |
| 2020/0259461 A1* | 8/2020 | Bouisse .................. H03F 3/245 |
| 2020/0389130 A1* | 12/2020 | Schultz ................ H04B 1/0458 |
| 2021/0050820 A1* | 2/2021 | Khalil .................... H03F 3/607 |
| 2022/0021343 A1* | 1/2022 | Hue ........................ H03F 1/42 |

* cited by examiner

HYBRID DOHERTY POWER AMPLIFIER MODULE

CROSS-REFERENCE TO RELATED APPLICATIONS

The present application is a non-provisional patent application claiming priority to Netherlands Patent Application No. NL 2027603, filed Feb. 19, 2021, the contents of which are hereby incorporated by reference.

FIELD OF THE DISCLOSURE

The present disclosure relates to a hybrid Doherty power amplifier module. The present disclosure further relates to a base station for mobile telecommunications comprising such a module. The present disclosure particularly relates to a hybrid Doherty power amplifier module and corresponding base station for 5G cellular networks, for example massive multiple input multiple output (m-MIMO) base stations.

BACKGROUND

In the past, power amplifiers used in base stations for mobile telecommunications, such as 4G base stations, were based on laterally diffused metal-oxide-semiconductor (LDMOS) transistors which were configured to output high powers at frequencies up to 2 GHz. The power amplifiers were typically based on the Doherty concept. In this concept, a signal to be amplified is first split by a Doherty splitter into various signal parts. These parts are then fed to a main amplifier and one or more peak amplifiers. After amplification, the various signal parts are combined using a Doherty combiner. In the Doherty concept, the main and peak amplifiers start operating at different input power levels. More in particular, the main amplifier is typically biased in class AB or B and the one or more peak amplifiers in class C. Furthermore, if multiple peak amplifiers are used, a different bias setting may be used for each of the peak amplifiers such that they become operational at different input power levels. In addition, the Doherty combiner uses one or more impedance inverters. These inverters ensure that at low input powers, when one or more of peak amplifiers are off, a higher impedance is presented at the output of the main amplifier than at high input powers. As such, the load seen by the main amplifier is modulated by the one or more peak amplifiers. This allows high efficiencies to be obtained when operating in power back-off.

Typically, the LDMOS transistors are packaged devices. The Doherty amplifier is then realized using a printed circuit board on which the LDMOS transistor packages are mounted. The Doherty combiner and splitter are realized on the printed circuit board using transmission lines and/or discrete components such as surface mount devices (SMDs). In these embodiments, hereinafter referred to as discrete solutions, the printed circuit board forms part of other circuitry, such as other circuitry of the base station.

In other embodiments, the Doherty amplifier is realized in a module form. In these embodiments, the LDMOS transistor dies are mounted on a printed circuit board. The Doherty combiner and splitter are also realized on this printed circuit board. The combination of the printed circuit board, LDMOS transistor dies, and circuitry on the printed circuit board is packaged as a module. Such module, hereinafter referred to as module solution, is then later arranged on a printed circuit board as a single amplifying unit.

In both the module and discrete solutions, at least part of the Doherty combiner and splitter can be realized on the same semiconductor die as the LDMOS transistor itself.

SUMMARY

Recent trends in telecommunications, such as 5G, impose more stringent requirements regarding output power and efficiency at higher operational frequencies. Wide bandgap materials, such as gallium nitride, have emerged as suitable candidates to address these needs. However, compared to LDMOS technologies, gallium nitride high electron mobility transistor (HEMT) technology offers less possibilities to integrate at least part of the Doherty combiner and splitter on the same semiconductor die as the power transistor in a cost efficient manner.

It is an object of the present disclosure to provide a Doherty power amplifier module that provides a solution to this problem.

According to the present disclosure, such solution is obtained using a hybrid Doherty power amplifier module as defined in claim 1. This module comprises a printed circuit board having an input RF terminal and an output RF terminal, and on which printed circuit board a primary Doherty amplifier is integrated. The primary Doherty amplifier comprises a primary Doherty splitter, a primary Doherty combiner, and a plurality of amplifying paths.

The primary Doherty splitter is arranged on the printed circuit board and is configured for splitting an input RF signal received at the input RF terminal into a plurality of RF signal components.

Each amplifying path is partially integrated on a semiconductor die of a first kind mounted on the printed circuit board and is partially integrated on a semiconductor die of a second kind mounted on the printed circuit board. Each amplifying path comprises a respective amplifying path output terminal arranged on the semiconductor die of the second kind and a respective amplifying path input terminal arranged on the semiconductor die of the first kind, wherein each amplifying path is configured to amplify a respective RF signal component received at its amplifying path input terminal from the primary Doherty splitter and to output the amplified RF signal component through its amplifying path output terminal. One amplifying path among the plurality of amplifying paths forms a main amplifier of the primary Doherty amplifier, and the remaining amplifying path(s) form(s) (a) respective peak amplifier(s) of the primary Doherty amplifier.

The primary Doherty combiner is arranged on the printed circuit board and is configured for combining the plurality of amplified RF signal components received from the plurality of amplifying paths and to output the combined amplified RF signal components through the output RF terminal.

Each amplifying path comprises a secondary Doherty amplifier integrated on the semiconductor die of the first kind and a final stage amplifier integrated on the semiconductor die of the second kind. Furthermore, the secondary Doherty amplifier is based on Silicon LDMOS, technology, and the final stage amplifier is based on GaN HEMT technology.

The present disclosure proposes a nested Doherty amplifier. More in particular, each amplifying path comprises a secondary Doherty amplifier that is fully realized on the silicon LDMOS die that drives a GaN final stage. In this manner, the advantages of silicon LDMOS technology and those of GaN are optimally combined. In addition, a plurality of amplifying paths is combined for forming the primary Doherty amplifier. Using this topology, the number of different components can be minimized, in particular when each amplifying path is substantial identical.

The secondary Doherty amplifiers of the plurality of amplifying paths can be integrated on a corresponding plurality of semiconductor dies of the first kind. In other embodiments, the secondary Doherty amplifiers of adjacent amplifying paths may be combined on a single semiconductor die of the first kind. Similarly, the final stage amplifiers of the plurality of amplifying paths can be integrated on a corresponding plurality of semiconductor dies of the second kind. Also here, a plurality of final stage amplifiers can be combined on a single semiconductor die of the second kind.

Each secondary Doherty amplifier may comprise a secondary main amplifier, a secondary peak amplifier, a secondary Doherty splitter, and a secondary Doherty combiner. The secondary Doherty splitter can be configured for splitting the RF signal component received at the amplifying path input terminal into a main part and a peak part and to provide those parts to the secondary main amplifier and the secondary peak amplifier, respectively. The secondary Doherty combiner can be configured for combining, at a combining node, the amplified main part and the amplified peak part.

For each amplifying path, the semiconductor die of the first kind may comprise a primary die output terminal that is connected, through an inter-stage matching network, to an input terminal of the final stage amplifier of that amplifying path. The semiconductor die of the first kind may further comprise a DC blocking capacitor arranged in between the respective combining node and the primary die output terminal. Additionally, the semiconductor die of the first kind may comprise a first shunt network arranged in between the combining node and ground and a second shunt network arranged in between the primary die output terminal and ground. The first shunt network may comprise a first DC bias input for receiving a DC signal for biasing the secondary Doherty amplifier. The second shunt network may comprise a second DC bias input for receiving a DC signal for biasing the final stage amplifier.

The first shunt network may comprise a series connection of a first inductor and a first capacitor, wherein the first DC bias input is formed by or electrically connected to a node at which the first inductor is connected to the first capacitor. Additionally or alternatively, the second shunt network may comprise a series connection of a second inductor and a second capacitor, wherein the second DC bias input is formed by or electrically connected to a node at which the second inductor is connected to the second capacitor.

Furthermore, the first shunt network can be configured to resonate at a frequency equal to an operational frequency of the hybrid Doherty power amplifier module divided by one of a and b, and wherein the second shunt network is configured to resonate at a frequency equal to the operational frequency of the hybrid Doherty power amplifier module divided by the other of a and b, wherein $1.9 < a < 1.3$, and wherein $0.5 < b < 0.8$. Using the first and second shunt networks, a bandpass characteristic can be obtained for signal transfer between the secondary Doherty amplifiers and the corresponding final stages. Typically, the hybrid Doherty power amplifier module is configured to amplify signals having a carrier frequency that lies within a given frequency band. The abovementioned operational frequency then corresponds to a center frequency of such frequency band.

Instead of using a single second shunt network, each semiconductor die of the first kind may comprise a pair of said second shunt networks each connected between the primary die output terminal and ground. Similarly, a pair of first shunt networks may be used.

The inter-stage matching network may comprise a first low-pass matching network in series with a second low-pass matching network. Each low-pass matching network may comprise a shunt capacitor and a series inductor and may have an input node and an output node. The input node of the first low-pass matching network may be connected to the primary die output terminal and the output node of the first-low pass matching network may be connected to the input node of the second low-pass matching network. The output node of the second low-pass matching network may be connected to the input terminal of the final stage.

In an embodiment, the series inductor of the first low-pass matching network is at least partially formed by one or more bondwires. Additionally or alternatively, the series inductor of the second low-pass matching network can be at least partially formed by one or more bondwires.

The shunt capacitor of the first low-pass matching network can be integrated on the semiconductor die of the first kind.

The shunt capacitor of the second low-pass matching network can be integrated on a semiconductor die of a third kind mounted on the printed circuit board. The abovementioned one or more bondwires forming the first inductor may then extend between the semiconductor die of the first kind and the semiconductor die of the third kind. The abovementioned one or more bondwires forming the second inductor may then extend between the semiconductor die of the third kind and the semiconductor die of the second kind. Alternatively, the shunt capacitor of the second low-pass matching network may comprise a surface mount device arranged on the printed circuit board.

The first and second low-pass networks can be designed such that at the or at an operational frequency, an absolute value of a complex impedance transformation ratio of the first low-pass network from the input node to the output node of the first-low pass network is at least 4 times greater than an impedance transformation ratio of the second low pass network from the input node to the output node of the second low pass network, preferably 10 times greater. Furthermore, the first and second low-pass networks can be designed such that at a second harmonic frequency corresponding to the operational frequency, an absolute value of an impedance seen looking towards the secondary Doherty amplifier at a node where the shunt capacitor and the series inductor of the second low-pass network and the series inductor of the first low-pass network are connected, is at least 3 times greater than an absolute value of an impedance of the shunt capacitor of the second low pass network, and more preferably at least 10 times greater. Furthermore, a series resonance frequency determined by the shunt capacitor and series inductor of the second low-pass network may lie within a range between 1.6 and 2.4 times the operational frequency.

Each secondary Doherty combiner may comprise a series inductor formed by an integrated inductor, such as spiral inductor, or one or more bondwires, arranged in between an output terminal of the secondary main amplifier and an output terminal of the secondary peak amplifier. The secondary Doherty combiner may additionally comprise a first shunt capacitor arranged between the output of the secondary main amplifier and ground, and a second shunt capacitor arranged between the output of the secondary peak amplifier and ground. The first and second shunt capacitors can be at least partially formed by a parasitic output capacitance of the secondary main and secondary peak amplifier, respectively, wherein the series inductor and the first and second shunt capacitors jointly form a lumped equivalent circuit of a quarter wavelength impedance inverter operating at or close to the fundamental frequency. In this manner, the parasitic output capacitance of the LDMOS transistors, which would otherwise deteriorate performance, can be absorbed in the lumped equivalent circuit.

The plurality of amplifying paths can be identical. Similarly, the semiconductor dies of the first kind of the plurality of amplifying paths can be identical, and/or the semiconductor dies of the second kind of the plurality of amplifying paths can be identical.

According to a second aspect, the present disclosure provides a base station for mobile telecommunications, such as 5G, comprising the hybrid Doherty power amplifier module according to any of the previous claims.

BRIEF DESCRIPTION OF THE DRAWINGS

Next, example embodiments will be described referring to the appended drawings, wherein.

DETAILED DESCRIPTION

Figure 1:
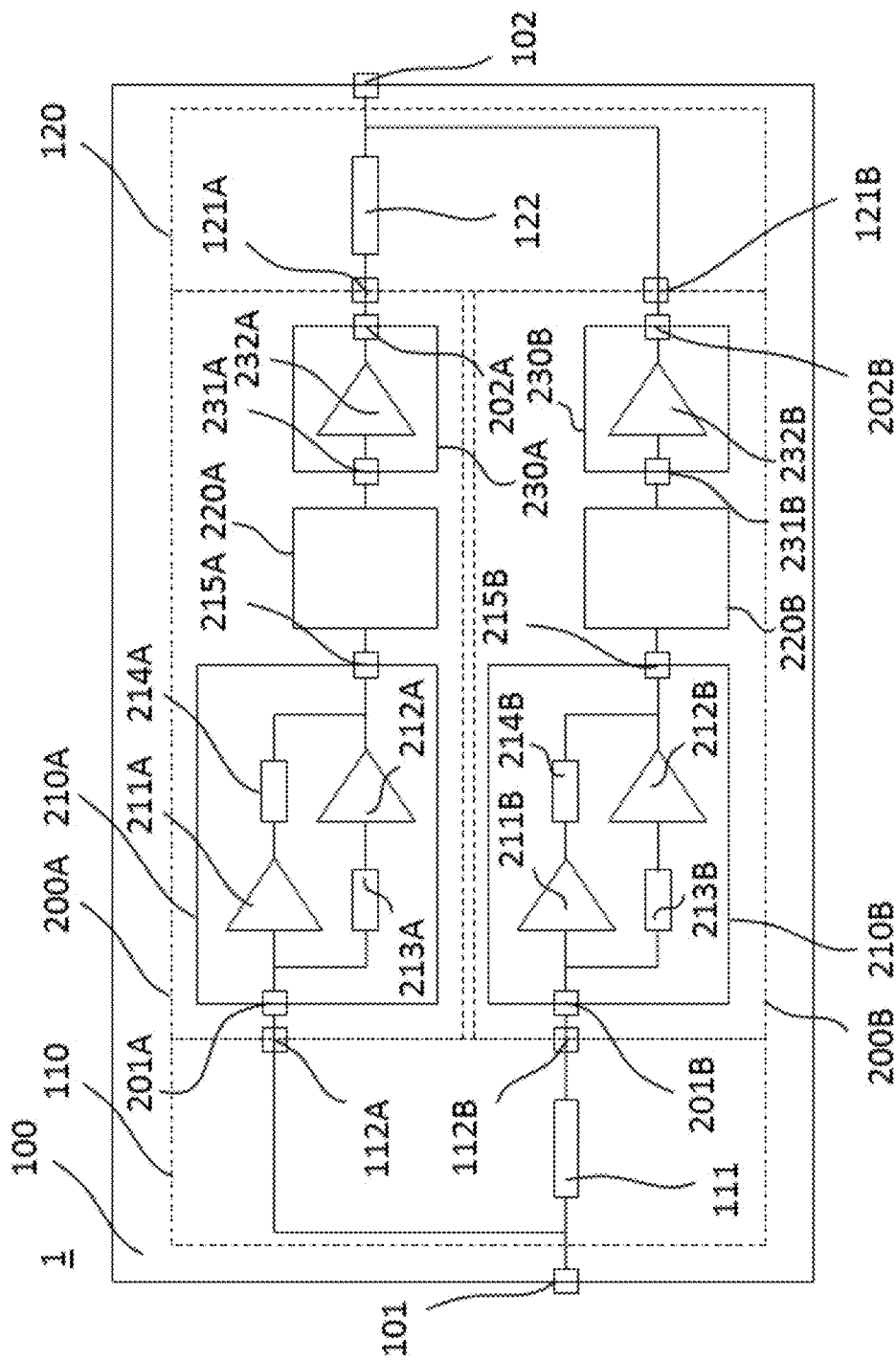
FIG. 1 schematically illustrates a general topology of the hybrid Doherty power amplifier module, according to example embodiments.

FIG. 1 illustrates an embodiment of a hybrid Doherty power amplifier module according to the present disclosure. Module 1 comprises a printed circuit board (PCB) 100 that is typically in the form of a multilayer laminate. PCB 100 comprises an input RF terminal 101 and an output RF terminal 102.

On PCB 100, a primary Doherty splitter 110 and a primary Doherty combiner 120 are arranged. Primary Doherty splitter 110 is configured for splitting an RF signal received at input RF terminal 101 into a plurality of RF signal components outputted at terminals 112A, 112B. In FIG. 1, one of these components is delayed by 90 degrees relative to the other component by a phase shifter 111.

Primary Doherty splitter 110 can be realized in various manners for example using discrete components, such as surface mount devices (SMDs) mounted on PCB 100 optionally in combination with transmission lines that are formed on PCB 100. In other embodiments, primary Doherty splitter 110 is formed solely using transmission lines formed on the PCB 100.

Module 1 further comprises two amplifying paths 200A, 200B. Each amplifying path 200A, 200B is partially integrated on a silicon die 210A, 210B that is mounted on PCB 100 and is partially integrated on a gallium nitride die 230A, 230B that is mounted on PCB 100. In addition, amplifying paths 200A, 200B each comprise an inter-stage matching network 220A, 220B of which two examples will be discussed in connection with in FIGS. 2 and 3.

Each amplifying path 200A, 200B comprises an amplifying path input terminal 201A, 201B and an amplifying output terminal 202A, 202B. Amplifying path input terminals 201A, 201B are generally formed on silicon dies 210A, 210B and amplifying path output terminals 202A, 202B on gallium nitride dies 230A, 230B.

Each silicon die 210A, 210B comprises a secondary main amplifier 211A, 211B and a secondary peak amplifier 212A, 212B that are each configured as a Si LDMOS transistor. Each silicon die 210A, 210B further comprises a secondary Doherty splitter, which in FIG. 1 is embodied as a phase shifter 213A, 213B. In addition, each silicon die 210A, 210B further comprises a secondary Doherty combiner, which in FIG. 1 is embodied as an impedance inverter 214A, 214B arranged in between an output of secondary main amplifier 211A, 211B and an output of secondary peak amplifier 212A, 212B. Impedance inverter 214A, 214B is configured to combine the signals amplified by secondary main amplifier 211A, 211B and secondary peak amplifier 212A, 212B at a combining node 215A, 215B. Impedance inverter 214A, 214B will be discussed in more detail in connection with FIGS. 2 and 3.

Each amplifying path 200A, 200B also comprises a gallium nitride based high electron mobility transistor, HEMT, 232A, 232B arranged on gallium nitride die 230A, 230B. In FIG. 1, inter-stage networks 220A, 220B connects combining node 215A, 215B to an input terminal 231A, 231B on gallium nitride die 230A, 230B.

Primary Doherty combiner 120 combines signals received at its inputs 121A, 121B from outputs 202A, 202B of amplifying paths 200A, 200B at RF output terminal 102. More in particular, primary Doherty combiner 120 comprises an impedance inverter 122 connected in between an output 202A of amplifying path 200A and RF output terminal 102. The phase delay introduced by impedance inverter 122, which is typically equal to 90 degrees, equals the phase delay introduced by phase shifter 111 such that the signals amplified by amplifying paths 200A, 200B add in-phase at RF output terminal 102. In addition, impedance inverter 122 provides a load modulation of the load seen by GaN based HEMT 232A depending on whether GaN based HEMT 232B is on or off.

Secondary main amplifiers 211A, 211B are typically biased in class AB or class B. Secondary peak amplifiers 212A, 212B are typically biased in class C. As a result, at low input powers, secondary peak amplifiers 212A, 212B will be in an off state and display a high output impedance. Due to impedance inverter 214A, 214B, this high output impedance during the off state will result in secondary main amplifiers 211A, 211B seeing a relatively high output impedance at their outputs. At high input powers, secondary peak amplifiers 212A, 212B will be in an on state and display a low output impedance. Due to impedance inverter 214A, 214B, this low output impedance will result in secondary main amplifiers 211A, 211B seeing a relatively low output impedance at their outputs. By presenting a higher load impedance under power back-off the efficiency of amplifying path 200A, 2008 can be increased.

Similar functionality is achieved with the amplifying paths 200A, 200B relative to each other. More in particular, in FIG. 1, amplifying path 200A operates as a primary main amplifier and amplifying path 200B as a primary peak amplifier. Under low input power conditions, amplifying path 200B will be in an off state, and amplifying path 200A in an on state. Under high input power conditions, both amplifying paths 200A, 200B will be in an on state. Due to impedance inverter 122, the load seen by GaN based HEMT 232A will be modulated to allow efficiency improvements under power back-off. Whether an amplifying path 200A, 200B behaves as a primary main amplifier or primary peak amplifier depends on the bias settings, for example the bias settings of GaN based HEMT 232A, 232B, although similar functionality could equally be obtained by additionally or alternatively biasing secondary main amplifiers 211A, 211B and secondary peak amplifiers 212A, 212B.

In a particular embodiment, amplifying paths 200A, 200B are identical. Here, it is noted that the bias settings for each amplifying path 200A, 200B are typically set by feeding appropriate signals from outside of the module. Put differently, the desired nested Doherty functionality can be achieved using identical amplifying paths 200A, 200B but biasing these paths differently. Using identical amplifying paths 200A, 200B greatly simplifies logistics and costs. Furthermore, module 1 can be easily scaled to i-way Doherty configurations, wherein n>2. In such modules, the amplifying paths would be arranged adjacently, similar to that shown in FIG. 1. Primary Doherty splitter 110 and primary Doherty combiner 120 would be configured differently in order to split and combine the various signals. Additionally or alternatively, instead of using a two-way Doherty amplifier on silicon dies 210A, 210B, multi-way Doherty amplifiers with two or more secondary peak amplifiers could be used. Furthermore, the present disclosure is not limited to the topology of the primary and secondary Doherty amplifier. For example, the primary and secondary Doherty amplifiers could each or both be embodied as an inverted Doherty amplifier.

Figure 2:
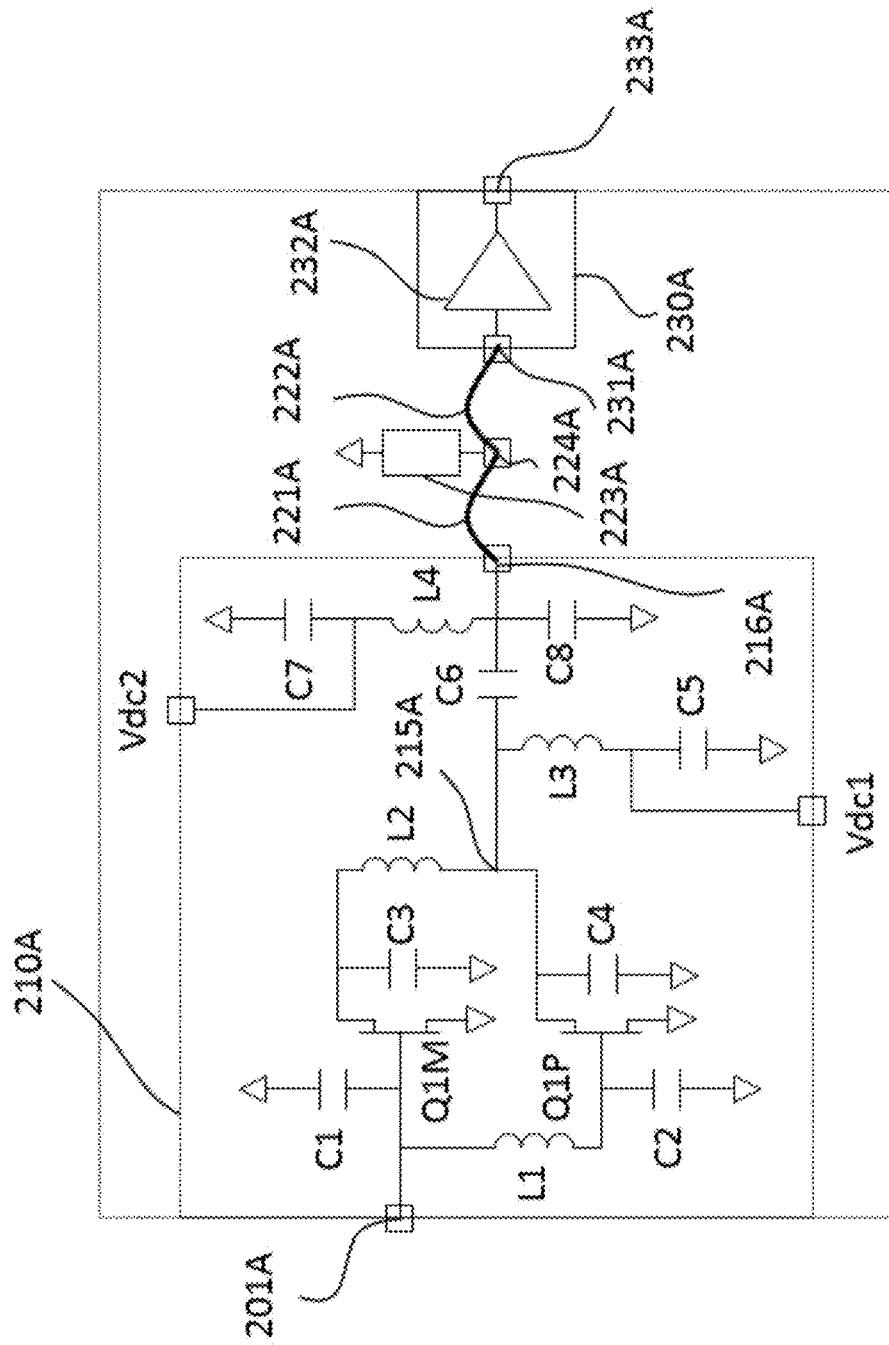
FIG. 2 schematically illustrates an amplifying path used in the topology of FIG. 1, according to example embodiments.
Figure 3:
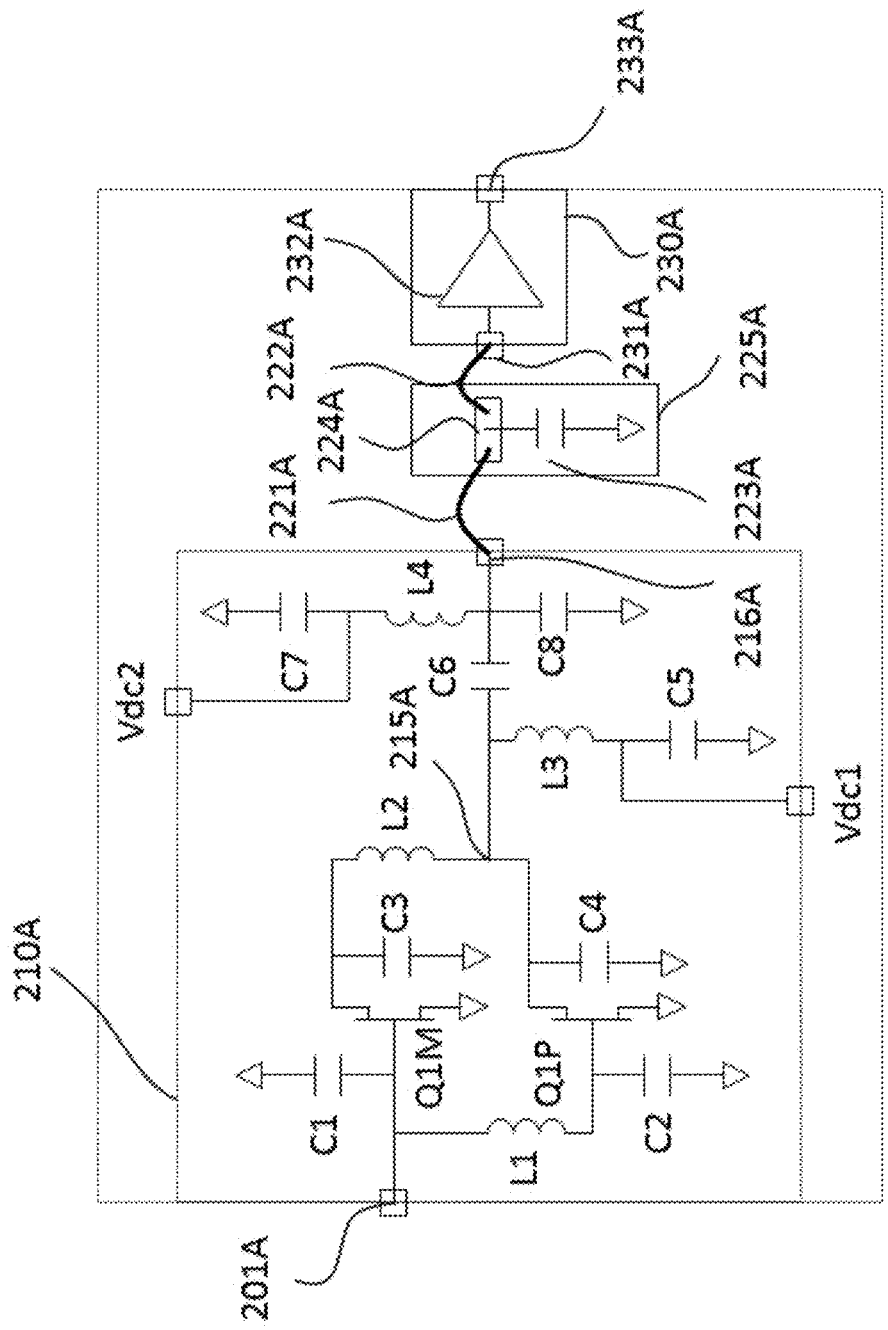
FIG. 3 schematically illustrates an amplifying path used in the topology of FIG. 1, according to example embodiments.

FIGS. 2 and 3 illustrate embodiments of amplifying path 200A in accordance with the present disclosure. In each of these embodiments, silicon die 210A comprises a main LDMOS transistor Q1M and a peak LDMOS transistor Q1P. Each of these transistors comprises an output capacitance. In FIGS. 2 and 3, these output capacitances are absorbed in the impedance inverter as will be discussed next.

Typically, an impedance inverter is realized using a quarter wavelength transmission line. Such line inverts a high impedance at the output of the transmission line to a low impedance at the input of the transmission line. A drawback of using quarter wavelength transmission lines is related to the size that is required. Instead of using a quarter wavelength transmission line, it is possible to use a C-L-C equivalent circuit. More in particular, in such equivalent circuit, the behavior at the operational frequency is approximated by a first shunt capacitor, a series inductor, and a second shunt capacitor. However, because Q1M and Q1P already have an intrinsic output capacitance, it becomes possible to use these output capacitances as part of the first and shunt capacitor. In some embodiments, the first and second shunt capacitors are solely formed by these output capacitances.

In FIGS. 2 and 3, capacitors C3 and C4 are realized as metal-insulator-metal capacitors, metal-oxide-semiconductor capacitors or the like, which, in combination with the output capacitance of Q1M and Q1P provide the required capacitance for the C-L-C equivalent circuit. The series inductor L2 can be formed using an integrated inductor, such as a spiral inductor, or can be formed using one or more bondwires.

A similar approach can be followed at the input side. Here, the required phase shifter can also be formed using a quarter wavelength transmission line that can equally be approximated by a C-L-C network. In FIGS. 2 and 3, capacitors C1 and C2 in combination with the input capacitances of Q1M and Q1P and series inductor L1 form the required shunt capacitances for realizing this C-L-C equivalent circuit. Similar to L2, inductor L1 can be formed using an integrated inductor, such as a spiral inductor, or can be formed using one or more bondwires.

In FIGS. 2 and 3, silicon die 210A further comprises a shunt network comprising a series connection of inductor L3 and capacitor C75. A node at which inductor L3 and capacitor C5 are connected to each other is connected to a terminal Vdc1. A DC bias may be supplied to this terminal for biasing Q1M and Q1P.

Furthermore, in FIGS. 2 and 3, silicon die 210A also comprises a shunt network comprising a series connection of inductor LA and capacitor C7. Anode at which inductor LA and capacitor C7 are connected to each other is connected to a terminal Vdc2. A DC bias may be supplied to this terminal for biasing GaN based HEMT 232A. A DC blocking capacitor C6 is used to separate the abovementioned biasing networks. Here, DC blocking capacitor C6 is connected in between combining node 215A and an output terminal 216A.

In FIGS. 2 and 3, the inter-stage matching network comprises two low-pass matching networks, each comprising a shunt capacitor and a series inductor. In FIGS. 2 and 3, the shunt capacitor C8 of the first low-pass matching network is arranged on silicon die 210A, and the corresponding series inductor is formed using one or more bondwires 221A extending between output terminal 216A and an intermediate terminal 224A arranged on PCB 100. In FIG. 2, shunt capacitor 223A of the second low-pass matching network is formed using an SMD capacitor that is arranged in between intermediate terminal 224A and ground. In FIG. 3, shunt capacitor 223A of the second low-pass matching network is integrated on a separate semiconductor die 225A. Intermediate terminal 224 is also arranged on this die 225A.

In FIGS. 2 and 3, the series inductor of the second low-pass matching network is formed using one or more bondwires 222A extending between intermediate terminal 224A and input terminal 231A of GaN based HEMT 232A, which terminal is arranged on GaN die 230A.

For both embodiments in FIGS. 2 and 3, it is very convenient to fine tune the inter-stage matching network as at least two components can be changed relatively quickly, i.e. by varying the shape and height of the bondwire(s).

In a particular embodiment, module 1 is provided with a land grid array or similar pattern on the backside of printed circuit board 100. Silicon dies 210A, 210B may have conductive substrates allowing grounding of Q1M or Q1P through the substrate. Silicon dies 210A, 210B may be mounted on die pads formed on PCB 100, which die pads are connected through one or more vias through PCB 100 to a ground pad formed on the backside of PCB 100. Signal pads may be arranged on the backside and around the edge of PCB 100 spaced apart from such ground pad. Through these signal pads, the RF signals may be outputted and inputted and bias voltages may be applied.

GaN die 230A may have a gallium nitride substrate, a silicon carbide or a silicon substrate. Depending on the substrate, vias through the substrate may be used to allow a ground to be formed on the backside of GaN die 230A. In this manner, GaN die 230A may also be mounted on a die pad arranged on PCB 100.

Module 1 may be provided with a lid that is connected to PCB 100. Alternatively, a solidified molding compound may cover silicon dies 210A, 210B and GaN dies 230A, 230B as well as other components on PCB 100. In such embodiment, the solidified molding compound forms an outside of module 1. In other embodiments, module 1 is provided without a separate lid or molding compound.

Instead of silicon dies 210A, 210B and GaN dies 230A, 230B being directly mounted on PCB 100, it is also possible to package these dies before mounting the packaged dies on PCB 100.

Figure 4:
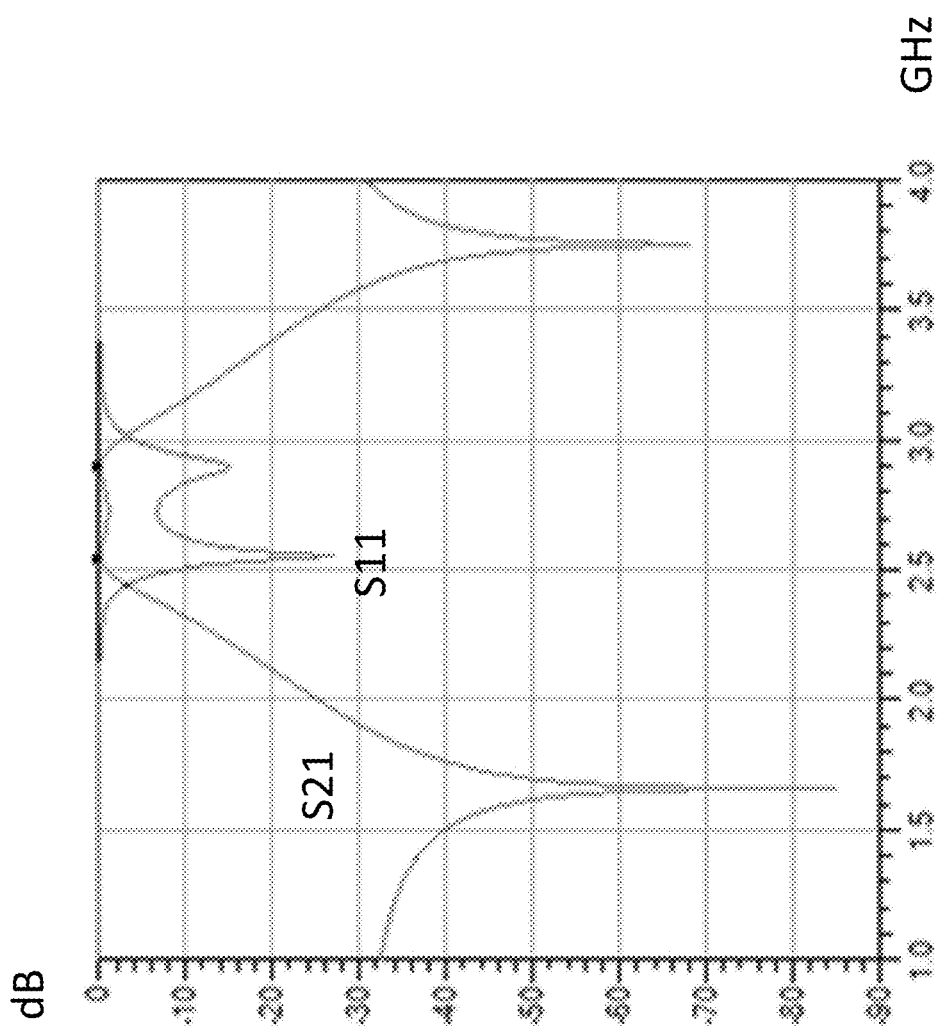
FIG. 4 schematically illustrates an RF performance of the inter-stage matching network used in the amplifying path of FIGS. 2 and 3, according to example embodiments.

FIG. 4 illustrates the S11 parameter and S21 parameter for the network of FIG. 2 between combining node 215A and input terminal 231A on GaN die 230A. As illustrated, the S21 parameter displays a bandpass characteristic. The notches in the S21 characteristic at roughly 1.7 and 3.7 GHz are attributed to the shunt network of L3 and C5 and that of L4 and C7.

An advantage of using the inter-stage matching topology is that if the series inductors, which are formed by bondwires 221A, 222A, are subject to process tolerance, e.g. the bondwires change with respect to their height, shape or length, it is still possible to maintain the shape of the S21 characteristic. For example, an increase in inductance associated with bondwires 221A can be compensated for by lowering an inductance associated with bondwires 222A. By maintaining the shape of the S21 characteristic, bandwidth performance can be kept relatively constant.

To improve the efficiency and output power of GaN based HEMT 232A, it is important to ensure that input terminal 231A is presented with a short at the second harmonic frequency. In FIGS. 2 and 3, this is obtained by appropriately choosing the series inductors and shunt capacitors of the low-pass matching networks. In the embodiments of FIGS. 2 and 3, a resonance frequency associated with a series connection of the series inductor associated with bondwires 222A, e.g. the series inductor of the second low-pass matching network, and the shunt capacitor of the second matching network is at or close to the second harmonic frequency. More in particular, at the second harmonic frequency, an impedance seen looking towards the secondary Doherty amplifier at intermediate terminal 224A, is at least c times greater than an impedance of shunt capacitor 223A, and more preferably d times greater. In addition, a series resonance frequency determined by the capacitor 223A and the series inductor of the second low pass network, i.e. the inductor formed by bondwire(s) 222A, lies within a range between 1.6 and 2.4 times the operational frequency. This latter resonance frequency $\omega_{res}$ can be found using the equation $\omega_{res}=1/\sqrt{LC}$, wherein L is the inductance associated with bondwire(s) 222A, and C the capacitance associated with capacitor 223A. Furthermore, at or close to the operational frequency, an absolute value of a complex impedance transformation ratio of the first low-pass network from terminal 216A to intermediate terminal 22A is at least 4 times greater than an impedance transformation ratio of the second low-pass network from intermediate terminal 216A to input terminal 231A. Put differently, instead of using equal impedance transformation ratios, the second low-pass network is predominantly used for presenting a low impedance at the second harmonic frequency at input terminal 231A.

Figure 5:
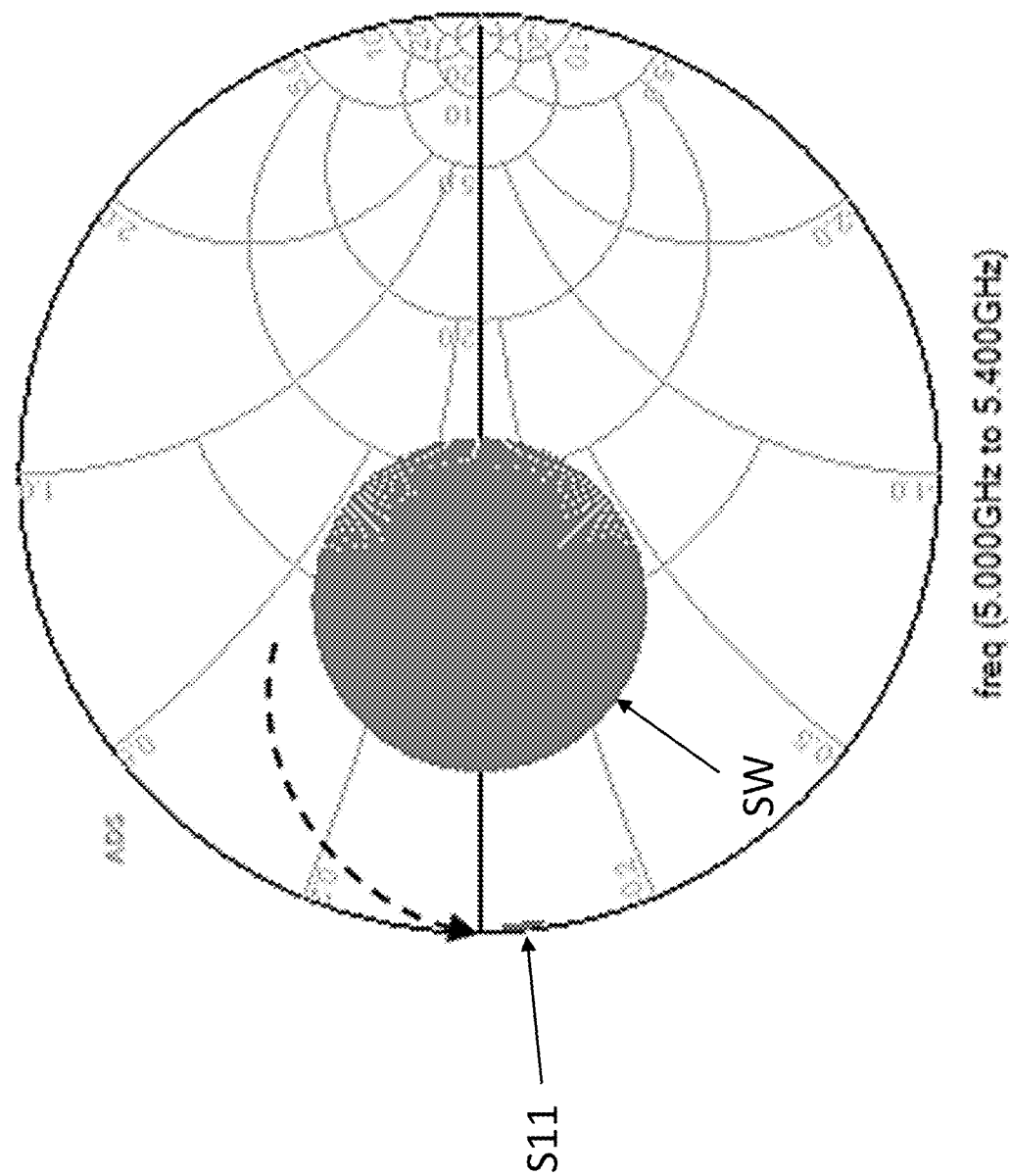
FIG. 5 schematically illustrates an RF performance of the inter-stage matching network used in the amplifying path of FIGS. 2 and 3, according to example embodiments.

The Applicant has found that by designing the inter-stage matching network in the manner described above in combination with the shunt networks LA, C7 and L3, C5, it is possible to achieve wide bandwidths while at the same time ensuring proper second harmonic termination of (GaN based HEMT 232A. This latter aspect is shown in more detail in FIG. 5, which illustrates the S1*l* parameter taken at input terminal 231A for various impedances connected at combining node 215A. These latter impedances model the impedances seen at this node looking towards QI M and Q1P under the various input signal conditions. More in particular, the impedances presented at combining node 215A correspond to a VSWR full phase sweep of a maximum ratio of 4:1, with the complex conjugate of the impedance at combining node 215A looking towards GaN based HEMT 232A as a reference impedance. As can be seen in the Smith chart of FIG. 5, the effective impedance presented at the second harmonic frequency is close to an RF short regardless the impedance at combining node 215A.

In the above, the present invention has been explained using detailed embodiments thereof. However, the present invention is not limited to these embodiments. Instead, various modifications are possible without deviating from the scope of the invention which is defined by the appended claims and their equivalents.

What is claimed is:

1. A hybrid Doherty power amplifier module, comprising:
a printed circuit board having an input RF terminal and an output RF terminal, and on which printed circuit board a primary Doherty amplifier is integrated, wherein the primary Doherty amplifier comprises:
  a primary Doherty splitter arranged on the printed circuit board and configured for splitting an input RF signal received at the input RF terminal into a plurality of RF signal components;
  a plurality of amplifying paths, each amplifying path being partially integrated on a semiconductor die of a first kind mounted on the printed circuit board and partially integrated on a semiconductor die of a second kind mounted on the printed circuit board, each amplifying path comprising a respective amplifying path output terminal arranged on the semiconductor die of the second kind and a respective amplifying path input terminal arranged on the semiconductor die of the first kind, wherein each amplifying path is configured to amplify a respective RF signal component received at its amplifying path input terminal from the primary Doherty splitter and to output the amplified RF signal component through its amplifying path output terminal, wherein one amplifying path among the plurality of amplifying paths forms a main amplifier of the primary Doherty amplifier, and wherein the remaining amplifying path(s) form(s) (a) respective peak amplifier(s) of the primary Doherty amplifier; and
  a primary Doherty combiner arranged on the printed circuit board and configured for combining the plurality of amplified RF signal components received from the plurality of amplifying paths and to output the combined amplified RF signal components through the output RF terminal,
wherein each amplifying path comprises a secondary Doherty amplifier integrated on the semiconductor die of the first kind and a final stage amplifier integrated on the semiconductor die of the second kind,
wherein the secondary Doherty amplifier is based on Silicon laterally diffused metal-oxide-semiconductor (LDMOS) technology, and
wherein the final stage amplifier is based on GaN high electron mobility transistor (HEMT) technology.

2. The hybrid Doherty power amplifier module according to claim 1, wherein for each amplifying path, the semiconductor die of the first kind comprises a primary die output terminal that is connected, through an inter-stage matching network, to an input terminal of the final stage amplifier of that amplifying path, wherein the inter-stage matching network comprises a first low-pass matching network in series with a second low-pass matching network, each low-pass matching network comprising a shunt capacitor and a series inductor and having an input node and an output node, wherein the input node of the first low-pass matching network is connected to the primary die output terminal, wherein the output node of the first low-pass matching network is connected to the input node of the second low-pass matching network, wherein the output node of the second low-pass matching network is connected to the input terminal of the final stage, wherein the first and second low-pass networks are designed such that at:

the or an operational frequency, an absolute value of a complex impedance transformation ratio of the first low-pass network from the input node to the output node of the first low-pass network is at least 4 times greater than an impedance transformation ratio of the second low-pass network from the input node to the output node of the second low-pass network; and a second harmonic frequency corresponding to the operational frequency, an absolute value of an impedance seen looking towards the secondary Doherty amplifier at a node where the shunt capacitor and the series inductor of the second low-pass network are connected is at least 3 times greater than an absolute value of an impedance of the shunt capacitor of the second low-pass network, and wherein a series resonance frequency determined by the shunt capacitor and series inductor of the second low-pass network lies within a range between 1.6 and 2.4 times the operational frequency.

3. The hybrid Doherty power amplifier module according to claim 2, wherein the series inductor of the first low-pass matching network is at least partially formed by one or more bondwires.

4. The hybrid Doherty power amplifier module according to claim 3, wherein the shunt capacitor of the second low-pass matching network is integrated on a semiconductor die of a third kind mounted on the printed circuit board, and wherein the one or more bondwires forming the first inductor extend between the semiconductor die of the first kind and the semiconductor die of the third kind.

5. The hybrid Doherty power amplifier module according to claim 2, wherein the series inductor of the second low-pass matching network is at least partially formed by one or more bondwires.

6. The hybrid Doherty power amplifier module according to claim 5, wherein the shunt capacitor of the second low-pass matching network is integrated on a semiconductor die of a third kind mounted on the printed circuit board, wherein the one or more bondwires forming the first inductor extend between the semiconductor die of the first kind and the semiconductor die of the third kind, and wherein the one or more bondwires forming the second inductor extend between the semiconductor die of the third kind and the semiconductor die of the second kind.

7. The hybrid Doherty power amplifier module according claim 2, wherein the shunt capacitor of the first low-pass matching network is integrated on the semiconductor die of the first kind.

8. The hybrid Doherty power amplifier module according to claim 2, wherein the shunt capacitor of the second low-pass matching network is integrated on a semiconductor die of a third kind mounted on the printed circuit board.

9. The hybrid Doherty power amplifier module according to claim 2, wherein the shunt capacitor of the second low-pass matching network comprises a surface mount device arranged on the printed circuit board.

10. The hybrid Doherty power amplifier module according to claim 1, wherein each secondary Doherty amplifier comprises:
a secondary main amplifier;
a secondary peak amplifier;
a secondary Doherty splitter configured for splitting the RF signal component received at the amplifying path input terminal into a main part and a peak part and to provide those parts to the secondary main amplifier and the secondary peak amplifier, respectively; and
a secondary Doherty combiner configured for combining, at a combining node, the amplified main part and the amplified peak part, wherein for each amplifying path, the semiconductor die of the first kind comprises:
a DC blocking capacitor arranged in between the respective combining node and the primary die output terminal;
a first shunt network arranged in between the combining node and ground, the first shunt network comprising a first DC bias input for receiving a DC signal for biasing the secondary Doherty amplifier; and
a second shunt network arranged in between the primary die output terminal and ground, the second shunt network comprising a second DC bias input for receiving a DC signal for biasing the final stage amplifier.

11. The hybrid Doherty power amplifier module according to claim 10, wherein the first shunt network comprises a series connection of a first inductor and a first capacitor, wherein the first DC bias input is formed by or electrically connected to a node at which the first inductor is connected to the first capacitor, and wherein the second shunt network comprises a series connection of a second inductor and a second capacitor, and wherein the second DC bias input is formed by or electrically connected to a node at which the second inductor is connected to the second capacitor.

12. The hybrid Doherty power amplifier module according to claim 11, wherein the first shunt network is configured to resonate at a frequency equal to an operational frequency of the hybrid Doherty power amplifier module divided by one of a and b, wherein the second shunt network is configured to resonate at a frequency equal to the operational frequency of the hybrid Doherty power amplifier module divided by the other of a and b, wherein $1.9<a<1.3$, and wherein $0.5<b<0.8$.

13. The hybrid Doherty power amplifier module according to claim 10, further comprising a pair of the second shunt networks each connected between the primary die output terminal and ground.

14. The hybrid Doherty power amplifier module according to claim 1, wherein the secondary Doherty amplifiers of the plurality of amplifying paths are integrated on a corresponding plurality of semiconductor dies of the first kind.

15. The hybrid Doherty power amplifier module according to claim 1, wherein the final stage amplifiers of the plurality of amplifying paths are integrated on a corresponding plurality of semiconductor dies of the second kind.

16. The hybrid Doherty power amplifier module according to claim 1, wherein each secondary Doherty combiner comprises a series inductor formed by an integrated inductor, such as spiral inductor, or one or more bondwires, arranged in between an output terminal of the secondary main amplifier and an output terminal of the secondary peak amplifier, a first shunt capacitor arranged between the output of the secondary main amplifier and ground, and a second shunt capacitor arranged between the output of the secondary peak amplifier and ground, wherein the first and second shunt capacitors are at least partially formed by parasitic output capacitance of the secondary main and peak amplifier, respectively, and wherein the series inductance and the first and second shunt capacitors jointly form a lumped equivalent circuit of a quarter wavelength impedance inverter operating at or close to the fundamental frequency.

17. The hybrid Doherty power amplifier module according to claim 1, wherein the plurality of amplifying paths are identical.

18. The hybrid Doherty power amplifier module according to claim 1, wherein the semiconductor dies of the first kind of the plurality of amplifying paths are identical.

19. The hybrid Doherty power amplifier module according to claim 1, wherein the semiconductor dies of the second kind of the plurality of amplifying paths are identical.

20. A base station for mobile telecommunications comprising the hybrid Doherty power amplifier module according to claim 1.

* * * * *